United States Patent
Furukawa et al.

(10) Patent No.: US 10,998,214 B2
(45) Date of Patent: May 4, 2021

(54) LIGHT IRRADIATION TYPE HEAT TREATMENT METHOD

(71) Applicant: SCREEN HOLDINGS CO., LTD., Kyoto (JP)

(72) Inventors: Masashi Furukawa, Kyoto (JP); Yoshio Ito, Kyoto (JP); Hiroki Yoshii, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 117 days.

(21) Appl. No.: 16/212,398

(22) Filed: Dec. 6, 2018

(65) Prior Publication Data

US 2019/0267270 A1    Aug. 29, 2019

(30) Foreign Application Priority Data

Feb. 28, 2018    (JP) .............................. JP2018-034639

(51) Int. Cl.
*H01L 21/677*    (2006.01)
*H01L 21/67*    (2006.01)
*H01L 21/687*    (2006.01)

(52) U.S. Cl.
CPC .... *H01L 21/67745* (2013.01); *H01L 21/6719* (2013.01); *H01L 21/67115* (2013.01); *H01L 21/67126* (2013.01); *H01L 21/67748* (2013.01); *H01L 21/6875* (2013.01);
(Continued)

(58) Field of Classification Search
CPC ......... H01L 21/67745; H01L 21/67115; H01L 21/68707; H01L 21/68742
See application file for complete search history.

(56) References Cited

U.S. PATENT DOCUMENTS

2013/0243550 A1*  9/2013  Yasui ................ H01L 21/67115
                                                           414/217
2014/0161429 A1   6/2014  Yokouchi et al.
2014/0170862 A1*  6/2014  Toyoda ................ H01L 21/324
                                                           438/795
(Continued)

FOREIGN PATENT DOCUMENTS

JP    2002-009007 A    1/2002
JP    2007-157747 A    6/2007
(Continued)

OTHER PUBLICATIONS

Korean Office Action issued in corresponding Korean Patent Application No. 10-2018-0167345, dated Mar. 5, 2020, with English translation.
(Continued)

*Primary Examiner* — Bac H Au
(74) *Attorney, Agent, or Firm* — McDermott Will & Emery LLP

(57) ABSTRACT

A transportation preparation operation for transporting a semiconductor wafer from a treatment chamber is started before a temperature of the semiconductor wafer decreases to a transportable temperature. A gate valve is closed after a treatment on the semiconductor wafer is started, and an operation of transporting the semiconductor wafer into the treatment chamber is completed. A period of time for treating the semiconductor wafer and a period of time for transporting the semiconductor wafer in and out are overlapped with each other, thus a time required for transporting the semiconductor wafer W into and out of the treatment chamber can be reduced.

4 Claims, 9 Drawing Sheets

(52) U.S. Cl.
CPC ............... *H01L 21/68707* (2013.01); *H01L 21/68735* (2013.01); *H01L 21/68742* (2013.01); *H01L 21/68785* (2013.01)

(56) References Cited

U.S. PATENT DOCUMENTS

| | | | |
|---|---|---|---|
| 2014/0273421 A1* | 9/2014 | Chan ................ | H01L 21/67745 438/530 |
| 2017/0092518 A1 | 3/2017 | Takano | |
| 2018/0005848 A1 | 1/2018 | Aoyama et al. | |
| 2019/0006218 A1* | 1/2019 | Toyoda ............. | H01L 21/67115 |

FOREIGN PATENT DOCUMENTS

| | | |
|---|---|---|
| JP | 2018-006513 A | 1/2018 |
| KR | 10-2014-0076501 A | 6/2014 |

OTHER PUBLICATIONS

Taiwanese Office Action issued in corresponding Taiwanese Patent Application No. 107139605, dated Aug. 20, 2019, with partial English translation of the Japanese translation of the Taiwanese Office Action.

Taiwanese Office Action issued in corresponding Taiwanese Patent Application No. 107139605, dated Apr. 30, 2020, with English translation of the Japanese translation of the Taiwanese Office Action.

Korean Decision to Grant a Patent issued in corresponding Korean Patent Application No. 10-2018-0167345, dated Oct. 21, 2020, with English translation.

Korean Notice of Final Rejection issued in corresponding Korean Patent Application No. 10-2018-0167345, dated Sep. 18, 2020, with English translation.

* cited by examiner

LIGHT IRRADIATION TYPE HEAT TREATMENT METHOD

BACKGROUND OF THE INVENTION

Field of the Invention

The present invention relates to a heat treatment method that irradiates a thin plate-like precision electronic substrate (hereinafter referred to simply as a "substrate") such as a semiconductor wafer with light to heat the substrate.

Description of the Background Art

In a semiconductor device manufacturing process, attention has been given to flash lamp annealing (FLA) for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising a temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

This flash lamp annealing is used for a heating treatment that needs to be performed in an extremely short time such as typically activation of impurities implanted in a semiconductor wafer. By irradiating a surface of a semiconductor wafer implanted with impurities by an ion implantation process, with a flash of light from flash lamps, it is possible to raise a temperature of the surface of the semiconductor wafer up to an activation temperature only for an extremely short time, and only activate impurities without deeply diffusing the impurities.

US2018/0005848 discloses a flash lamp annealer which preheats a semiconductor wafer by halogen lamps disposed on a lower side of a treatment chamber, and subsequently irradiates a surface of the semiconductor wafer with a flash of light from flash lamps disposed on an upper side of the treatment chamber. In the annealer disclosed in US2018/0005848, a transport robot performs a wafer switching of taking out a semiconductor wafer on which the heating treatment has been performed from the treatment chamber and transporting an untreated semiconductor wafer into the treatment chamber to sequentially perform the treatment on a plurality of semiconductor wafers.

In the annealer disclosed in US2018/0005848, when the semiconductor wafer on which the heating treatment has been performed is transported from the treatment chamber, after the semiconductor wafer is cooled to a predetermined temperature or less, a transfer arm for transferring the semiconductor wafer is driven and a gate valve of the treatment chamber is opened. Also when the untreated semiconductor wafer is transported into the treatment chamber, the transfer arm and the gate valve are driven. Since some degree of time is required for the driving, there arises a problem that the time required for transporting the semiconductor wafer is lengthened as a result.

SUMMARY OF THE INVENTION

The present invention is intended for a heat treatment method of heating a substrate by irradiating the substrate with light.

According to one aspect of the present invention, the heat treatment method includes: (a) heating a first substrate being held by a susceptor in a chamber by irradiating the first substrate with light from lamps; and (b) turning off the lamps to cool the first substrate to a transportable temperature at which the first substrate can be transported from the chamber, wherein a transportation preparation operation for transporting the first substrate from the chamber is started before a temperature of the first substrate decreases to the transportable temperature.

The transportation preparation operation is started during a treatment period of the first substrate, thus the time required for transporting the substrate into and out of the chamber can be reduced.

The heat treatment method preferably comprises (d) causing a transport hand of a transport robot being provided outside the chamber to receive the first substrate whose temperature is decreased to the transportable temperature from the lift pins and transport the first substrate from the chamber, wherein even after the first substrate is transported from the chamber, the transfer arms do not return to the retracted position but remain in the transfer operation position.

A time required for the transfer arms to move between the retracted position and the transfer operation position can be reduced.

Preferably, it is determined whether or not the transport hand holds the first substrate in a period of travel time from when the transport hand receives the first substrate and moves out of the transport opening until when the transport hand stops.

A time required for determining presence or absence of the substrate can be reduced.

The heat treatment method preferably further comprises (e) causing the transport hand of the transport robot to transport a second substrate from the transport opening into the chamber after the first substrate is transported from the chamber, wherein the gate valve is closed after the second substrate is transported into the chamber and treatment on the second substrate is started.

The treatment is started before the operation of transporting the second substrate into the chamber is completed, thus the time required for transporting the substrate into and out of the chamber can be further reduced.

Accordingly, the object of the present invention is to reduce a time required for transporting the substrate into and out of the chamber.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described in detail with reference to the drawings.

Figure 1:
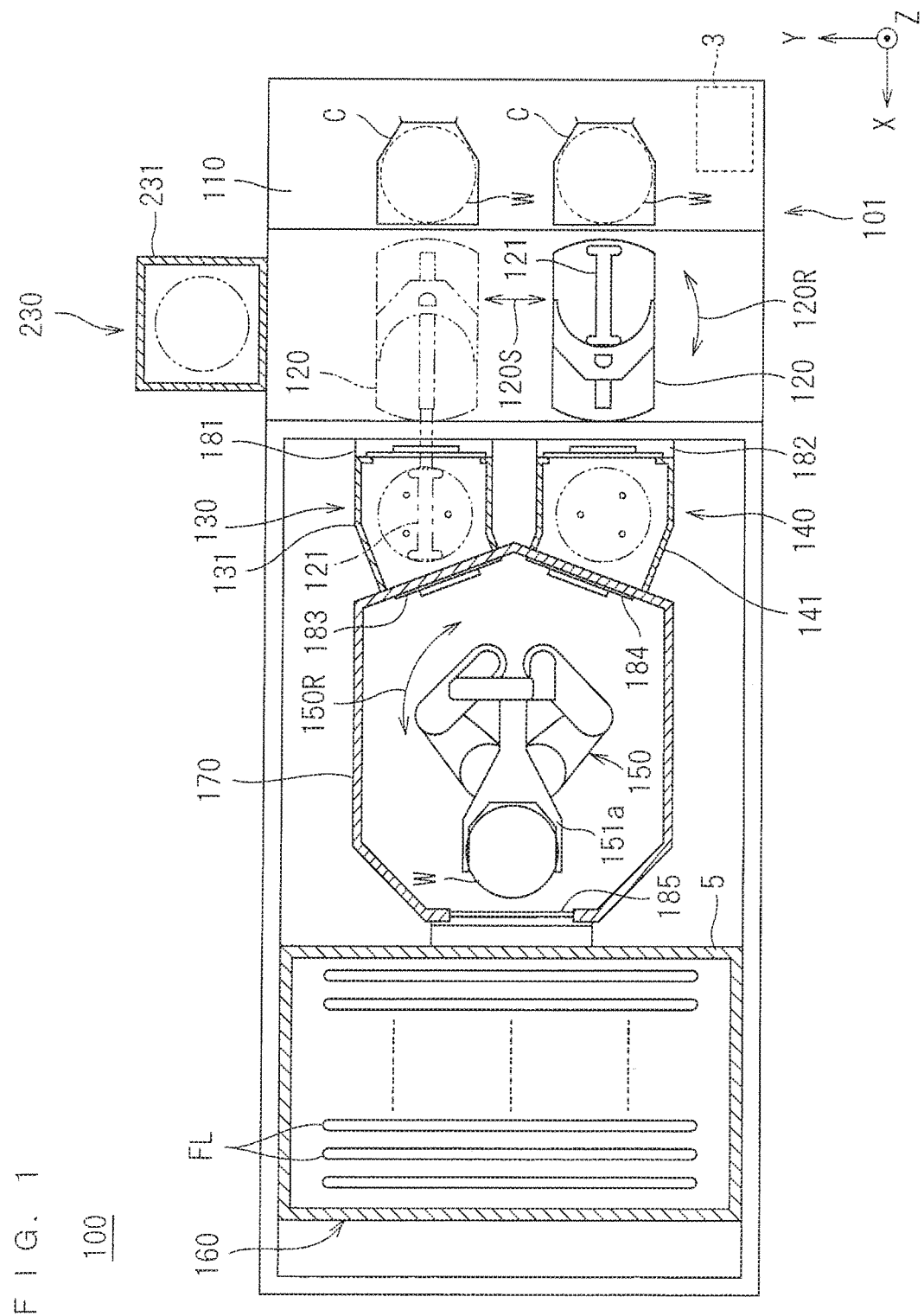
FIG. 1 is a plan view showing a heat treatment apparatus used in a heat treatment method according to the present invention.
Figure 2:
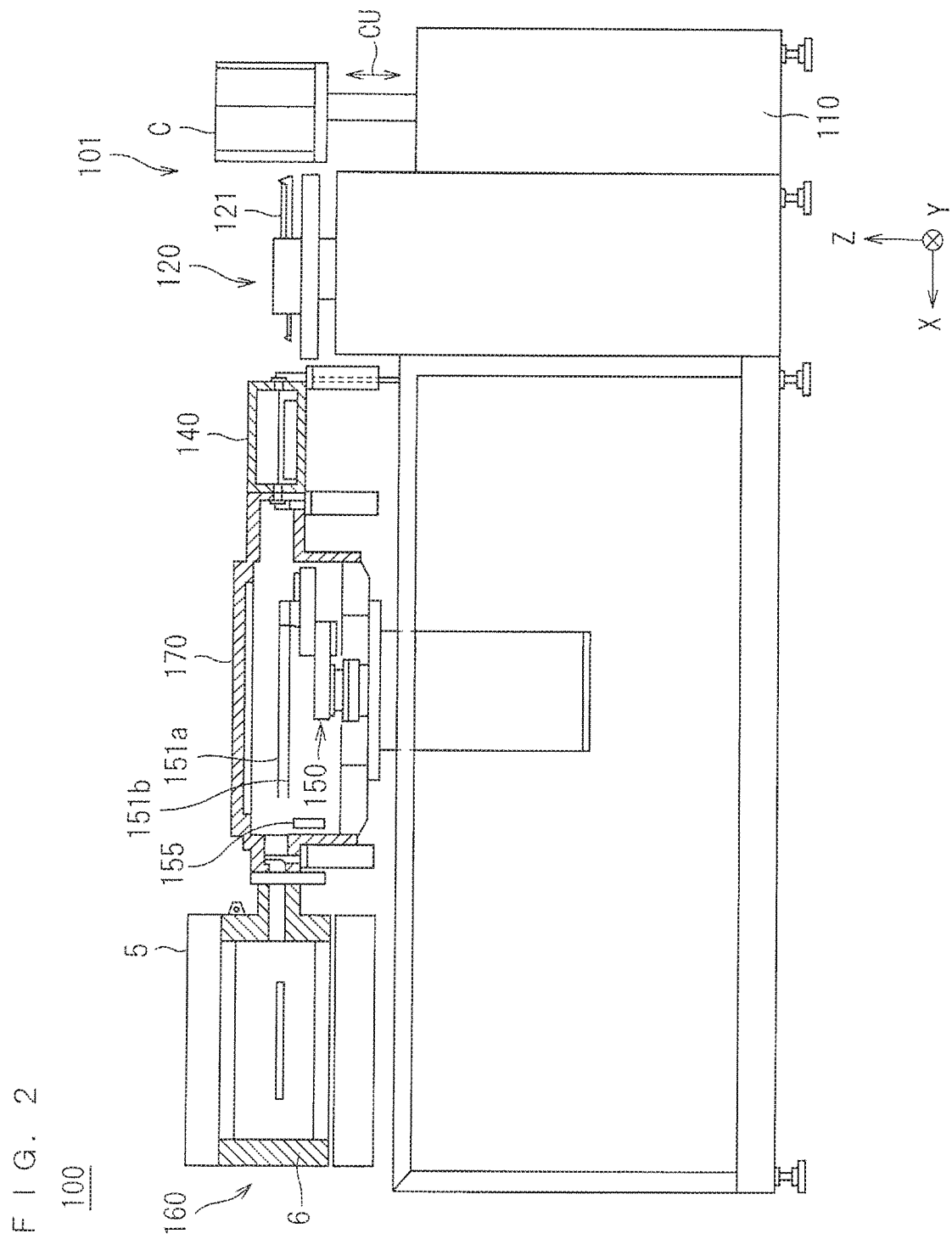
FIG. 2 is a front view of the heat treatment apparatus in FIG. 1.
Figure 3:
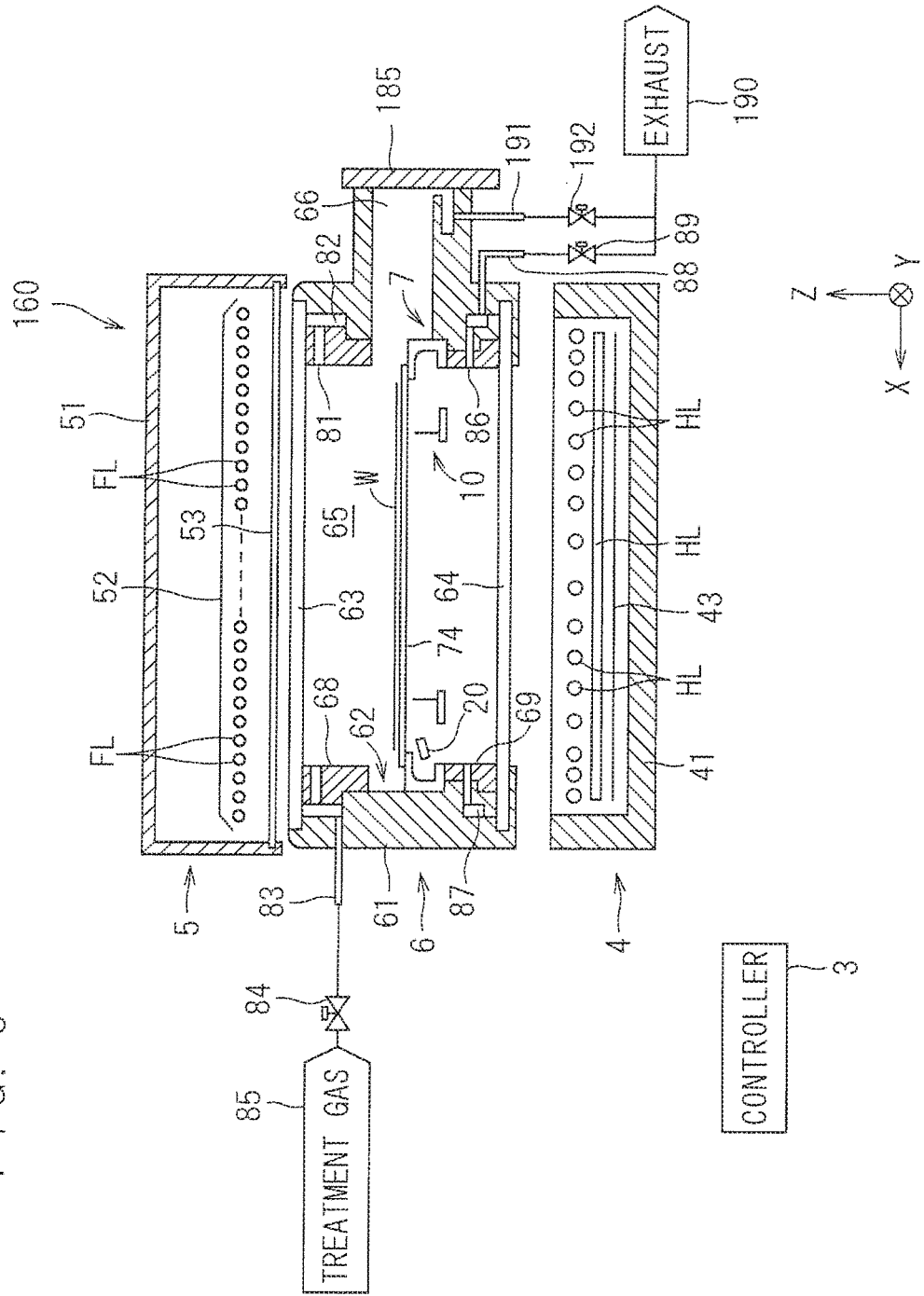
FIG. 3 is a longitudinal cross-sectional view showing a configuration of a heat treatment unit.

Firstly, a heat treatment apparatus for implementing a heat treatment method according to the present invention will be described. FIG. 1 is a plan view showing a heat treatment apparatus 100 used in the heat treatment method according to the present invention. FIG. 2 is a front view of the heat treatment apparatus 100. The heat treatment apparatus 100 is a flash lamp annealer for heating a disk-shaped semiconductor wafer W serving as a substrate by irradiating the semiconductor wafer W with a flash of light. A size of the semiconductor wafer W to be treated is not particularly limited. For example, the semiconductor wafer W to be treated has a diameter of 300 mm or 450 mm. The semiconductor wafer W prior to the transport into the heat treatment apparatus 100 is implanted with impurities. The heat treatment apparatus 100 performs a heating treatment on the semiconductor wafer W to thereby activate the impurities implanted in the semiconductor wafer W. It should be noted that dimensions of components and a total number of components are shown in exaggeration or in simplified form, as appropriate, in FIG. 1 and the subsequent drawings for the sake of easier understanding. Further, each of FIGS. 1 to 3 shows an XYZ orthogonal coordinate system whose Z axis direction is a vertical direction and whose XY plane is a horizontal plane to clarify a direction relationship between the drawings.

As shown in FIGS. 1 and 2, the heat treatment apparatus 100 includes an indexer 101 for transporting the untreated semiconductor wafer W from outside into the heat treatment apparatus 100 and transporting the treated semiconductor wafer W out of the heat treatment apparatus 100, an alignment part 230 for positioning the untreated semiconductor wafer W, two coolers 130 and 140 for cooling the semiconductor wafer W on which the heat treatment has been performed, a heat treatment unit 160 for performing a flash heating treatment on the semiconductor wafer W, and a transport robot 150 for transferring the semiconductor wafer W to and from the coolers 130 and 140 and the heat treatment unit 160. Further, the heat treatment apparatus 100 includes a controller 3 for controlling an operation mechanism provided in each of the above treatment units, and the transport robot 150 to proceed with the flash heating treatment of the semiconductor wafer W.

The indexer 101 includes a load port 110 for aligning and placing a plurality of (in the present preferred embodiment, two) carriers C, and a transfer robot 120 for taking out the untreated semiconductor wafer W from each carrier C and housing the treated semiconductor wafer W in each carrier C. The carrier C having received the untreated semiconductor wafer W is transported by an unmanned transport vehicle (an AGV or an OHT), for example, and is placed on the load port 110. The carrier C having received the treated semiconductor wafer W is carried away from the load port 110 by the unmanned transport vehicle.

Further, the load port 110 is configured to be able to upwardly and downwardly move the carrier C as indicated by an arrow CU in FIG. 2 such that the transfer robot 120 can transport any semiconductor wafer W into and out of the carrier C. In addition, a form of the carrier C may be a front opening unified pod (FOUP) for receiving the semiconductor wafer W in an enclosed space, and, in addition, a standard mechanical interface (SMIF) pod or an open cassette (OC) for exposing the received semiconductor wafer W to outdoor air.

Further, the transfer robot 120 can perform slide movement indicated by an arrow 120S in FIG. 1, and a turning operation indicated by an arrow 120R and an upward/downward movement operation. By this means, the transfer robot 120 transports the semiconductor wafer W into and out of the two carriers C, and transfers the semiconductor wafer W to and from the alignment part 230 and the two coolers 130 and 140. The transfer robot 120 transports the semiconductor wafer W into and out of the carrier C by sliding and moving a hand 121 and moving the carrier C upwardly and downwardly. Further, the transfer robot 120 transfers the semiconductor wafer W to and from the alignment part 230 or the coolers 130 and 140 by sliding and moving the hand 121 and operating the transfer robot 120 to move upwardly and downwardly.

The alignment part 230 is connected to a side of the indexer 101 along a Y axis direction. The alignment part 230 is a treatment part for rotating the semiconductor wafer W in the horizontal plane, and directing the semiconductor wafer W in a direction suitable for flash heating. The alignment part 230 includes, inside an alignment chamber 231 that is an enclosure made of an aluminum alloy, a mechanism for supporting the semiconductor wafer W in a horizontal attitude and rotating the semiconductor wafer W, and a mechanism for optically detecting, for example, a notch or an orientation flat formed at a peripheral portion of the semiconductor wafer W.

The semiconductor wafer W is transferred to and from the alignment part 230 by the transfer robot 120. The semiconductor wafer W is transferred from the transfer robot 120 to the alignment chamber 231 such that a wafer center is located at a predetermined position. The alignment part 230 rotates the semiconductor wafer W around a vertical direction axis about a rotation center that is a center portion of the semiconductor wafer W received from the indexer 101, and optically detects, for example, a notch to adjust a direction of the semiconductor wafer W. The semiconductor wafer W whose direction has been adjusted is taken out of the alignment chamber 231 by the transfer robot 120.

As a transport space of the semiconductor wafer W by the transport robot 150, a transport chamber 170 for housing the transport robot 150 is provided. Three sides of this transport chamber 170 are connected in communication with a treatment chamber 6 of the heat treatment unit 160, a first cooling chamber 131 of the cooler 130 and a second cooling chamber 141 of the cooler 140.

The heat treatment unit 160 that is a main part of the heat treatment apparatus 100 is a substrate treatment part for performing a flash heating treatment on the preheated semiconductor wafer W by irradiating the semiconductor wafer W with a flash (a flash of light) from xenon flash lamps FL. A configuration of the heat treatment unit 160 will be described in more detail below.

The two coolers 130 and 140 employ the substantially same configuration. Each of the coolers 130 and 140 includes a metal cooling plate inside the first cooling chamber 131 and the second cooling chamber 141, each of which is an enclosure made of an aluminum alloy, and a quartz plate placed on an upper surface of the cooling plate (neither of the cooling plate and the quartz plate is shown). A temperature of the cooling plate is adjusted to a room temperature (approximately 23° C.) by a Peltier element or constant temperature water circulation. When the semiconductor wafer W on which the flash heating treatment has been performed in the heat treatment unit 160 is transported into the first cooling chamber 131 or the second cool chamber 141, the semiconductor wafer W is placed on the quartz plate and cooled.

Each of the first cooling chamber 131 and the second cool chamber 141 is connected to and between both of the indexer 101 and the transport chamber 170. Each of the first cooling chamber 131 and the second cool chamber 141 is provided with two openings formed for transporting the semiconductor wafer W in and out. The opening of the two openings of the first cool chamber 131 connected to the indexer 101 is openable and closable by a gate valve 181. The opening of the first cooling chamber 131 connected to the transport chamber 170 is openable and closable by a gate valve 183. In other words, the first cooling chamber 131 and the indexer 101 are connected with the gate valve 181 interposed therebetween, and the first cooling chamber 131 and the transport chamber 170 are connected with the gate valve 183 interposed therebetween.

When the semiconductor wafer W is transferred between the indexer 101 and the first cooling chamber 131, the gate valve 181 is opened. When the semiconductor wafer W is transferred between the first cooling chamber 131 and the transport chamber 170, the gate valve 183 is opened. When the gate valve 181 and the gate valve 183 are closed, the inside of the first cooling chamber 131 is an enclosed space.

The opening of the two openings of the second cool chamber 141 connected to the indexer 101 is openable and closable by a gate valve 182. The opening of the second cooling chamber 141 connected to the transport chamber 170 is openable and closable by a gate valve 184. In other words, the second cooling chamber 141 and the indexer 101 are connected with the gate valve 182 interposed therebetween, and the second cooling chamber 141 and the transport chamber 170 are connected with the gate valve 184 interposed therebetween.

When the semiconductor wafer W is transferred between the indexer 101 and the second cooling chamber 141, the gate valve 182 is opened. When the semiconductor wafer W is transferred between the second cooling chamber 141 and the transport chamber 170, the gate valve 184 is opened. When the gate valve 182 and the gate valve 184 are closed, the inside of the second cooling chamber 141 is an enclosed space.

Furthermore, each of the coolers 130 and 140 is provided with a gas supply mechanism for supplying clean nitrogen gas into the first cooling chamber 131 and the second cool chamber 141, and an exhaust mechanism for exhausting atmosphere in the chambers. The gas supply mechanism and the exhaust mechanism may be able to switch a flow rate in two levels.

The transport robot 150 provided in the transport chamber 170 is turnable about an axis along the vertical direction as indicated by an arrow 150R. The transport robot 150 includes two linkage mechanisms including a plurality of arm segments. Distal ends of the two linkage mechanisms are respectively provided with transport hands 151a and 151b for holding the semiconductor wafer W. The transport hands 151a and 151b are disposed vertically spaced a predetermined pitch apart from each other, and are linearly slidable by the linkage mechanisms in the same horizontal direction independently from each other. The transport robot 150 moves upwardly and downwardly a base provided with the two linkage mechanisms to move the two transport hands 151a and 151b upwardly and downwardly in a state where the two transport hands 151a and 151b are spaced the predetermined pitch apart.

When the transport robot 150 transfers (transports) the semiconductor wafer W to or from the first cooling chamber 131, the second cooling chamber 141 or the treatment chamber 6 of the heat treatment unit 160 as a transfer party, both of the transport hands 151a and 151b first turn to face the transfer party, and then (or during the turn) move upwardly and downwardly to reach a height for transferring the semiconductor wafer W between one of the transport hands and the transfer party. The transport hand 151a (151b) is linearly slid and moved in the horizontal direction to transfer the semiconductor wafer W to or from the transfer party.

The semiconductor wafer W can be transferred between the transport robot 150 and the transfer robot 120 via the coolers 130 and 140. That is, the first cooling chamber 131 of the cooler 130 and the second cooling chamber 141 of the cooler 140 also function as paths for transferring the semiconductor wafer W between the transport robot 150 and the transfer robot 120. More specifically, by transferring the semiconductor wafer W transferred by one of the transport robot 150 and the transfer robot 120 to the first cooling chamber 131 or the second cooling chamber 141 to the other one, the semiconductor wafer W is transferred.

As described above, the gate valves 181 and 182 are provided between the first cooling chamber 131 and the second cooling chamber 141, and the indexer 101, respectively. The gate valves 183 and 184 are provided between the transport chamber 170, and the first cooling chamber 131 and the second cooling chamber 141, respectively. A gate valve 185 is provided between the transport chamber 170 and the treatment chamber 6 of the heat treatment unit 160. When the semiconductor wafer W is transported in the heat treatment apparatus 100, these gate valves are opened and closed as appropriate.

A wafer sensor 155 is provided in the transport chamber 170 (FIG. 2). The wafer sensor 155 is made up of a light projecting/receiving sensor, and determines whether or not the transport hand 151a (151b) of the transport robot 150 holds the semiconductor wafer W. Specifically, the wafer sensor 155 determines that the transport hand 151a (151b) holds the semiconductor wafer W when projected light is blocked, and determines that the transport hand 151a (151b) does not hold the semiconductor wafer W when the projected light is not blocked. When the transport robot 150 transfers the semiconductor wafer W to and from the treatment chamber 6, the transport hand 151a (151b) moves along the predetermined route. The wafer sensor 155 determines whether or not the transport hand 151a (151b) holds the semiconductor wafer W when the transport hand 151a (151b) passes through a specific position in the predetermined route. Nitrogen gas is supplied into the transport chamber 170 and the alignment chamber 231, too, from the gas supply part, and atmospheres in the transport chamber 170 and the alignment chamber 231 are exhausted by an exhaust part (neither of the gas supply part and the exhaust part is shown).

Next, a configuration of the heat treatment unit 160 will be described. FIG. 3 is a longitudinal cross-sectional view showing a configuration of the heat treatment unit 160. The heat treatment unit 160 includes the treatment chamber 6 for receiving a semiconductor wafer W therein and performing a heating treatment, a flash lamp house 5 including a plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment unit 160 further includes a holder 7 provided inside the treatment chamber 6 and for holding the semiconductor wafer W in a horizontal attitude, and a transfer mechanism 10 for transferring the semiconductor wafer W between the holder 7 and the transport robot 150.

The treatment chamber 6 is configured by mounting upper and lower chamber windows made of quartz to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the treatment chamber 6 is a disk-shaped member made of quartz, and serves as a quartz window that transmits a flash of light emitted from the flash lamps FL therethrough into the treatment chamber 6. The lower chamber window 64 forming a floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds the semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of the semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, the semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen ($N_2$) gas, and reactive gases such as hydrogen ($H_2$) gas and ammonia ($NH_3$) gas (although nitrogen gas is used in the present preferred embodiment).

At least one gas exhaust opening 86 for exhausting gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and may be in the form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 4:
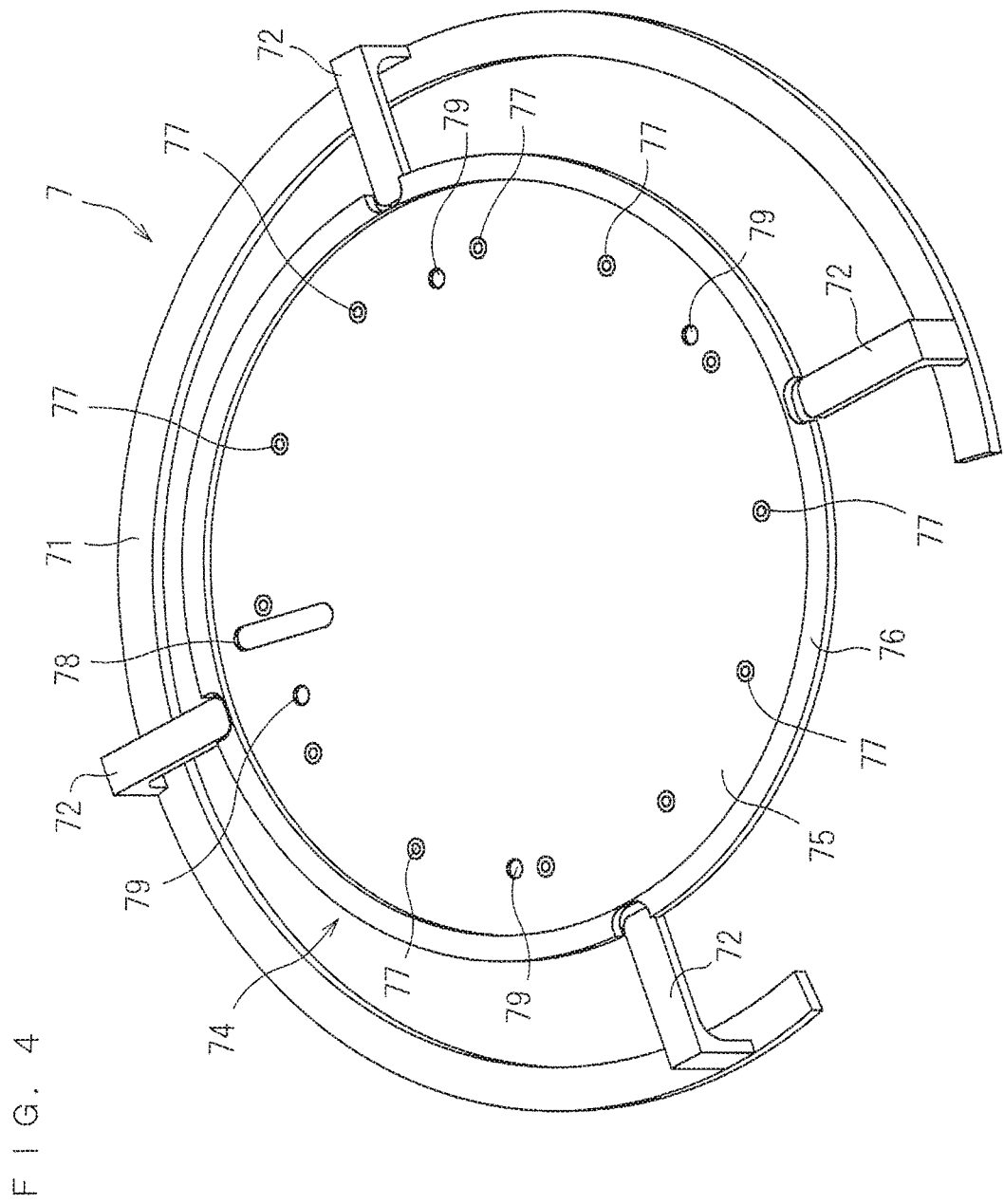
FIG. 4 is a perspective view showing an entire external appearance of a holder.

FIG. 4 is a perspective view showing an entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the treatment chamber 6 by being placed on the bottom surface of the recessed portion 62 (with reference to FIG. 3). The multiple coupling portions 72 (in the present preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 5:
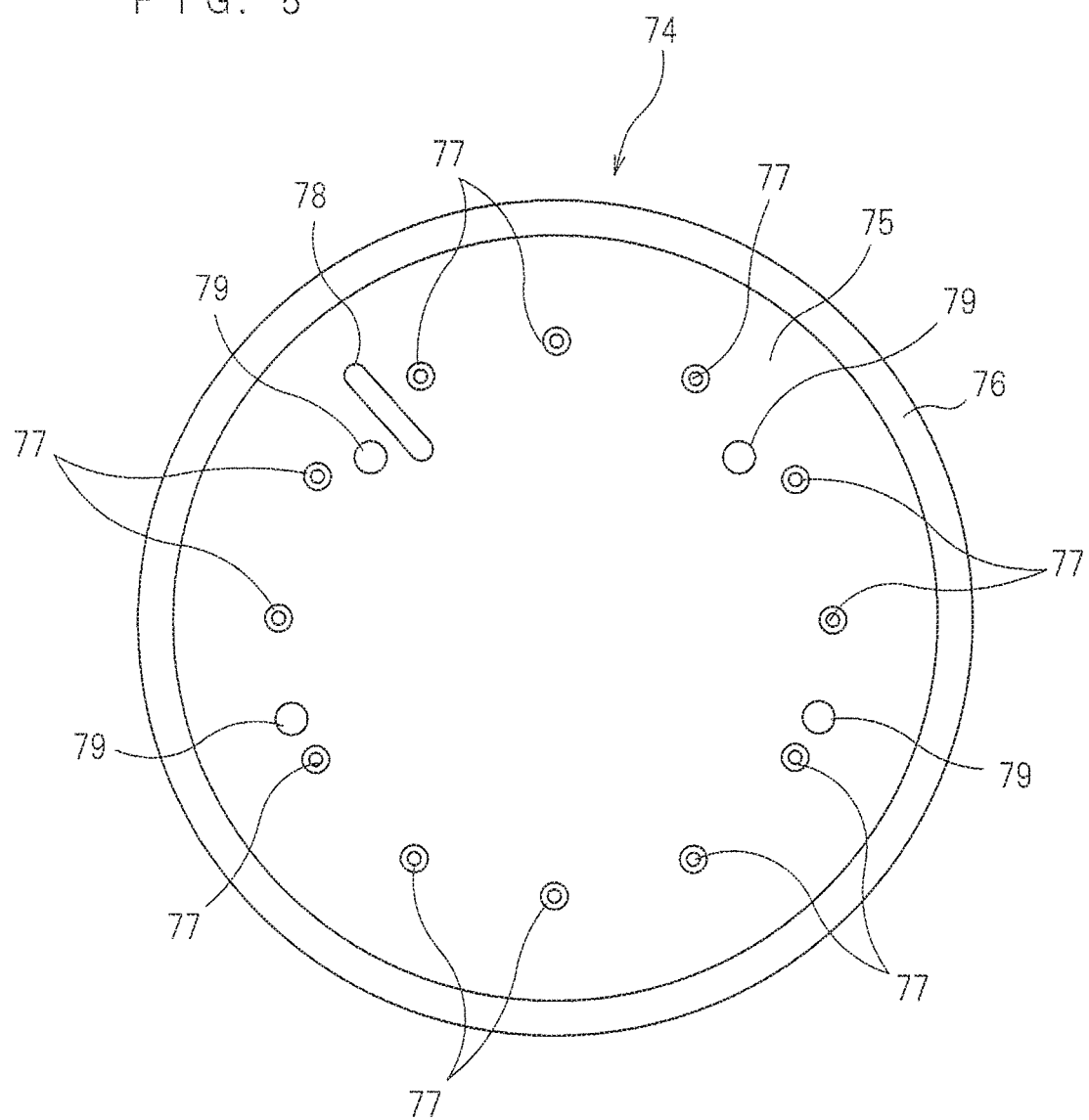
FIG. 5 is a plan view of a susceptor.
Figure 6:
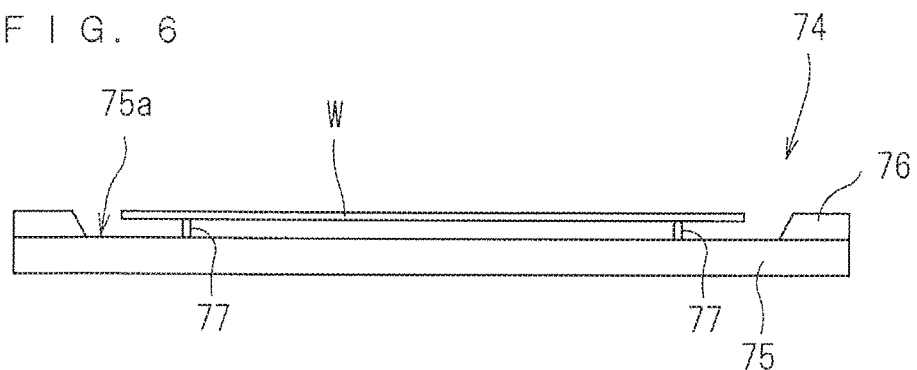
FIG. 6 is a cross-sectional view of the susceptor.

The susceptor 74 is supported by the four coupling portions 72 provided on the base ring 71. FIG. 5 is a plan view of the susceptor 74. FIG. 6 is a cross-sectional view of the susceptor 74. The susceptor 74 includes a holding plate 75, a guide ring 76, and a plurality of substrate support pins 77. The holding plate 75 is a generally circular planar member made of quartz. A diameter of the holding plate 75 is greater than that of the semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75*a* for holding the semiconductor wafer W. The substrate support pins 77 are provided upright on the holding surface 75*a* of the holding plate 75. In the present preferred embodiment, a total of 12 substrate support pins 77 provided upright are spaced at intervals of 30 degrees along the circumference of a circle concentric with the outer circumference of the holding surface 75*a* (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 4, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the treatment chamber 6. With the holder 7 mounted to the treatment chamber 6, the holding plate 75 of the susceptor 74 assumes a horizontal attitude (an attitude such that the normal to the susceptor 74 coincides with the vertical direction). In other words, the holding surface 75*a* of the holding plate 75 becomes a horizontal surface.

The semiconductor wafer W transported into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75*a* of the holding plate 75).

The semiconductor wafer W supported by the substrate support pins 77 is spaced a predetermined distance apart from the holding surface 75*a* of the holding plate 75. A thickness of the guide ring 76 is greater than the height of the substrate support pins 77. Thus, the guide ring 76 prevents the horizontal misregistration of the semiconductor wafer W supported by the substrate support pins 77.

As shown in FIGS. 4 and 5, an opening 78 is formed in the holding plate 75 of the susceptor 74 so as to extend vertically through the holding plate 75 of the susceptor 74. The opening 78 is provided for a radiation thermometer 20 (see FIG. 3) to receive radiation (infrared radiation) emitted from the lower surface of the semiconductor wafer W supported by the susceptor 74. In other words, the radiation thermometer 20 receives the light emitted from the lower surface of the semiconductor wafer W held by the susceptor 74 through the opening 78, and measures the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer the semiconductor wafer W.

Figure 7:
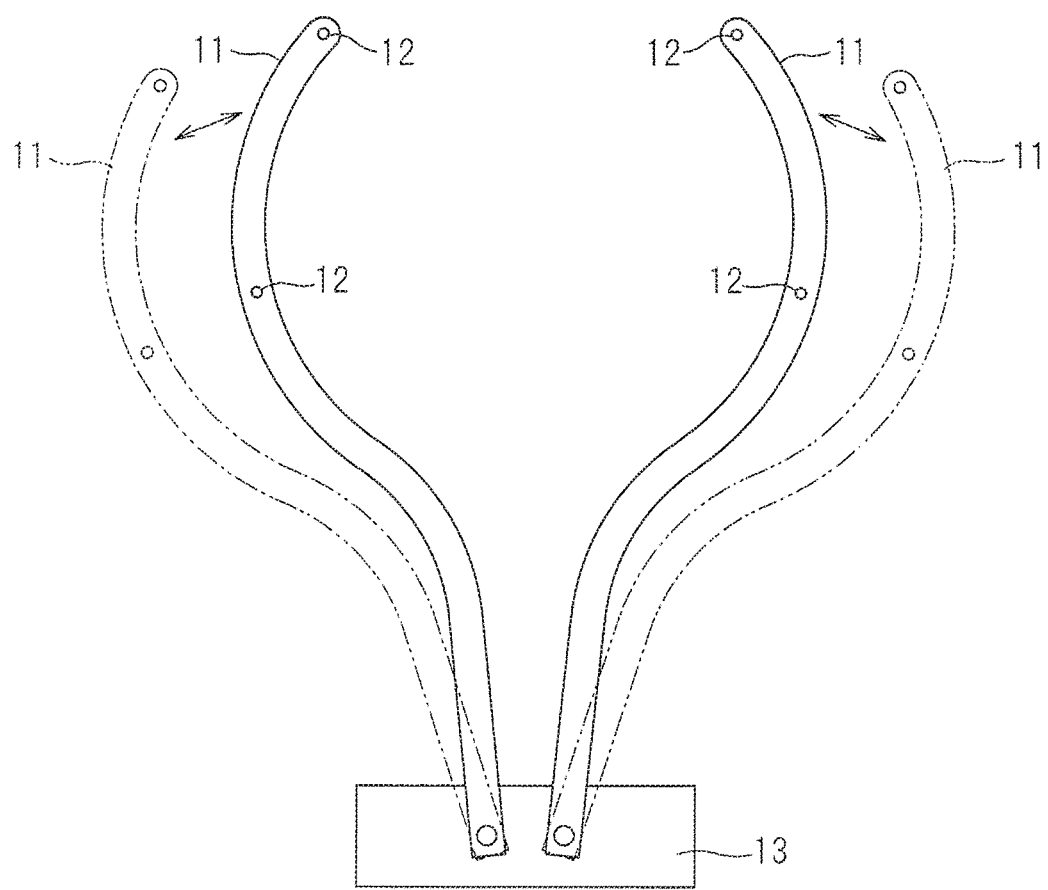
FIG. 7 is a plan view of a transfer mechanism.
Figure 8:
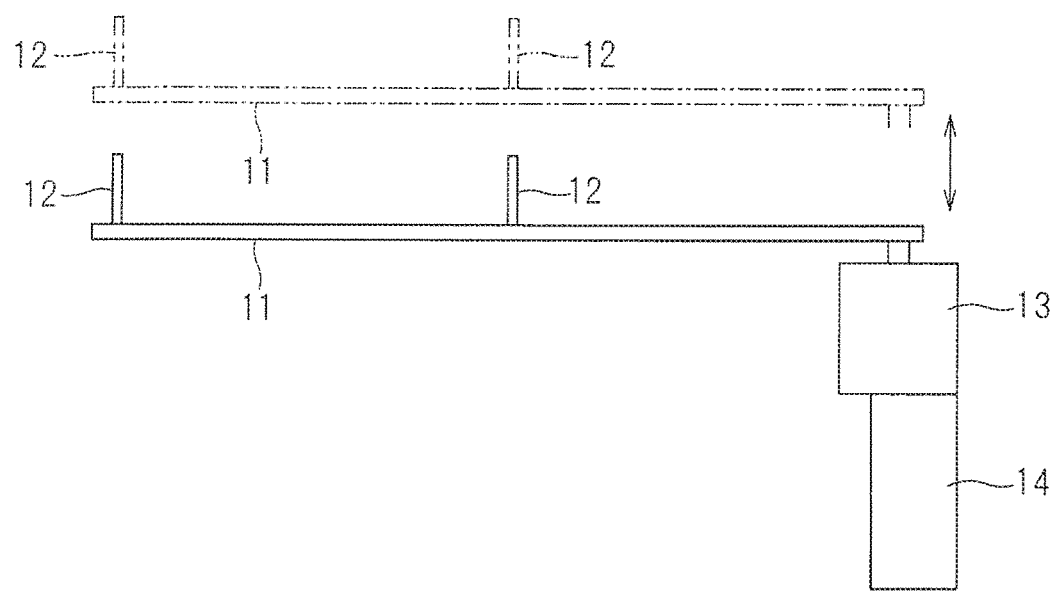
FIG. 8 is a side view of the transfer mechanism.

FIG. 7 is a plan view of the transfer mechanism 10. FIG. 8 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dash-double-dot lines in FIG. 7) in which the transfer arms 11 do not overlap the semiconductor wafer W held by the holder 7 as seen in plan view. The transfer operation position is located below the susceptor 74 and the retracted position is located outside the susceptor 74. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 4 and 5) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

Referring again to FIG. 3, the flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holder 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

Figure 9:
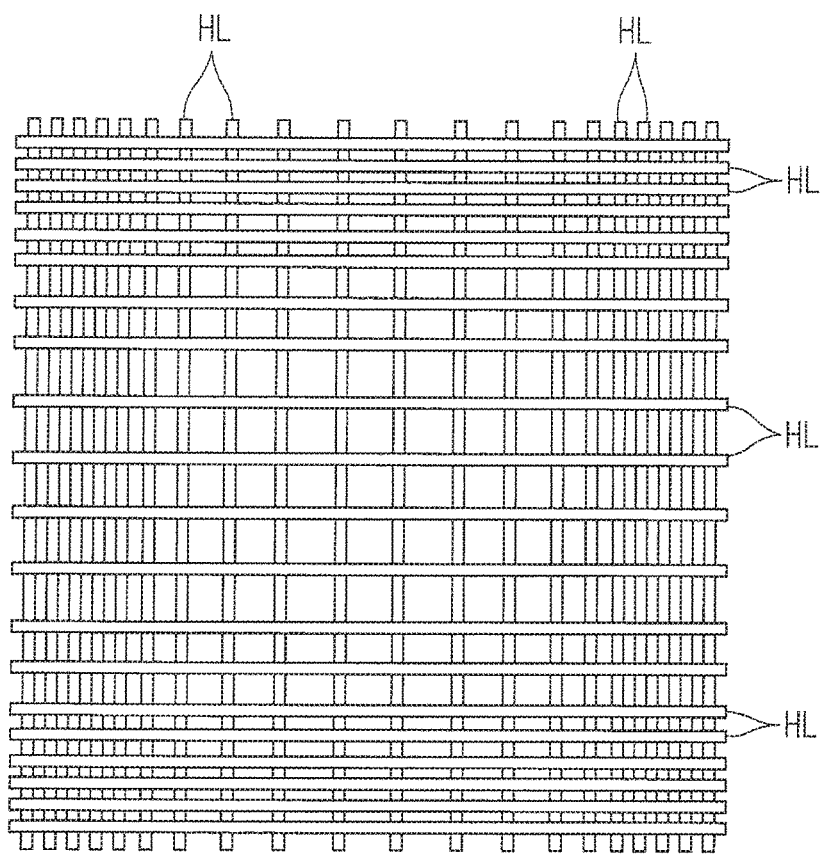
FIG. 9 is a plan view showing an arrangement of a plurality of halogen lamps.

FIG. 9 is a plan view showing an arrangement of the multiple halogen lamps HL. In the present preferred embodiment, the 20 halogen lamps HL are disposed in each of two upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in the horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of each halogen lamp HL arranged in the upper tier and the longitudinal direction of each halogen lamp HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 3). The reflector 43 reflects the light emitted from the halogen lamps HL toward the heat treatment space 65.

The controller 3 controls the aforementioned various operating mechanisms provided in the heat treatment apparatus 100. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined treatment program, whereby the processes in the heat treatment apparatus 100 proceed. Although FIG. 1 shows the controller 3 in the indexer 101, the controller 3 is not limited to this, and can be arranged at any position in the heat treatment apparatus 100.

The heat treatment unit 160 further includes, in addition to the aforementioned components, various cooling structures to prevent an excessive temperature rise in the halogen lamp house 4, the flash lamp house 5 and the treatment chamber 6 because of the heat energy generated from the halogen lamps HL and the flash lamps FL during the heat treatment of the semiconductor wafer W. As an example, a water cooling tube (not shown) is provided in the walls of the treatment chamber 6. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

Next, a treatment operation of the semiconductor wafer W in the heat treatment apparatus 100 according to the present invention will be described. The semiconductor wafer W to be treated herein is a semiconductor substrate doped with impurities (ions) by an ion implantation process. The impurities are activated by the heat treatment apparatus 100 performing the process of heating (annealing) the semiconductor wafer W by irradiation with a flash of light. Hereinafter, a rough transport procedure of the semiconductor wafer W in the heat treatment apparatus 100, and a heating treatment of the semiconductor wafer W in the heat treatment unit 160 will be described.

Firstly, a plurality of untreated semiconductor wafers W implanted with impurities and received in the carriers C is placed on the load port 110 of the indexer 101. The transfer robot 120 takes out the untreated semiconductor wafers W one by one from the carrier C to transport the semiconductor wafers W into the alignment chamber 231 of the alignment part 230. In the alignment chamber 231, the semiconductor wafer W supported in a rotation supporter is rotated around the vertical direction axis about the rotation center that is the center portion of the semiconductor wafer W in the horizontal plane, and a notch, for example, is optically detected to adjust a direction of the semiconductor wafer W.

Next, the transfer robot 120 of the indexer 101 takes out the semiconductor wafer W whose direction has been adjusted, from the alignment chamber 231 to transport the semiconductor wafer W into the first cooling chamber 131 of the cooler 130 or the second cooling chamber 141 of the cooler 140. The untreated semiconductor wafer W transported into the first cooling chamber 131 or the second cooling chamber 141 is transported out to the transport chamber 170 by the transport robot 150. When the untreated semiconductor wafer W is transported from the indexer 101 to the transport chamber 170 via the first cooling chamber 131 or the second cooling chamber 141, the first cooling chamber 131 and the second cooling chamber 141 function as the paths for transferring the semiconductor wafer W.

The transport robot 150 having taken out the semiconductor wafer W turns to face toward the heat treatment unit 160. Subsequently, the transport robot 150 transports the untreated semiconductor wafer W into the treatment chamber 6. At this time, if the preceding semiconductor wafer W on which the heating treatment has been performed is in the treatment chamber 6, one of the transport hands 151a and 151b takes out the semiconductor wafer W on which the heating treatment has been performed and then the other one of the transport hands 151a and 151b transports the untreated semiconductor wafer W into the treatment chamber 6, whereby the wafers are replaced.

The semiconductor wafer W transported into the treatment chamber 6 is preheated by the halogen lamps HL, and then is subjected to the flash heating treatment by flash irradiation from the flash lamps FL. This flash heating treatment activates the impurities. The flash heating treatment in the heat treatment unit 160 and the wafer switching performed on the treatment chamber 6 are described in detail below.

After the flash heating treatment is finished, the transport robot 150 transports the semiconductor wafer W on which the flash heating treatment has been performed out of the treatment chamber 6 to the transport chamber 170. The transport robot 150 having taken out the semiconductor wafer W turns to face toward the first cooling chamber 131 or the second cooling chamber 141 from the treatment chamber 6.

Subsequently, the transport robot 150 transports the semiconductor wafer W on which the heating treatment has been performed into the first cooling chamber 131 of the cooler 130 or the second cooling chamber 141 of the cooler 140. The first cooling chamber 131 or the second cooling chamber 141 performs a cooling treatment on the semiconductor wafer W on which the flash heating treatment has been performed. At a point in time when the semiconductor wafer W is transported out of the treatment chamber 6 of the heat treatment unit 160, the temperature of the entire semiconductor wafer W is relatively high, and therefore is cooled to approximately a room temperature by the first cooling chamber 131 or the second cooling chamber 141. After a predetermined cooling treatment time passes, the transfer robot 120 transports the cooled semiconductor wafer W out of the first cooling chamber 131 or the second cooling chamber 141 to return the semiconductor wafer W to the carrier C. After the carrier C receives a predetermined number of treated semiconductor wafers W, this carrier C is transported out of the load port 110 of the indexer 101.

Figure 10:
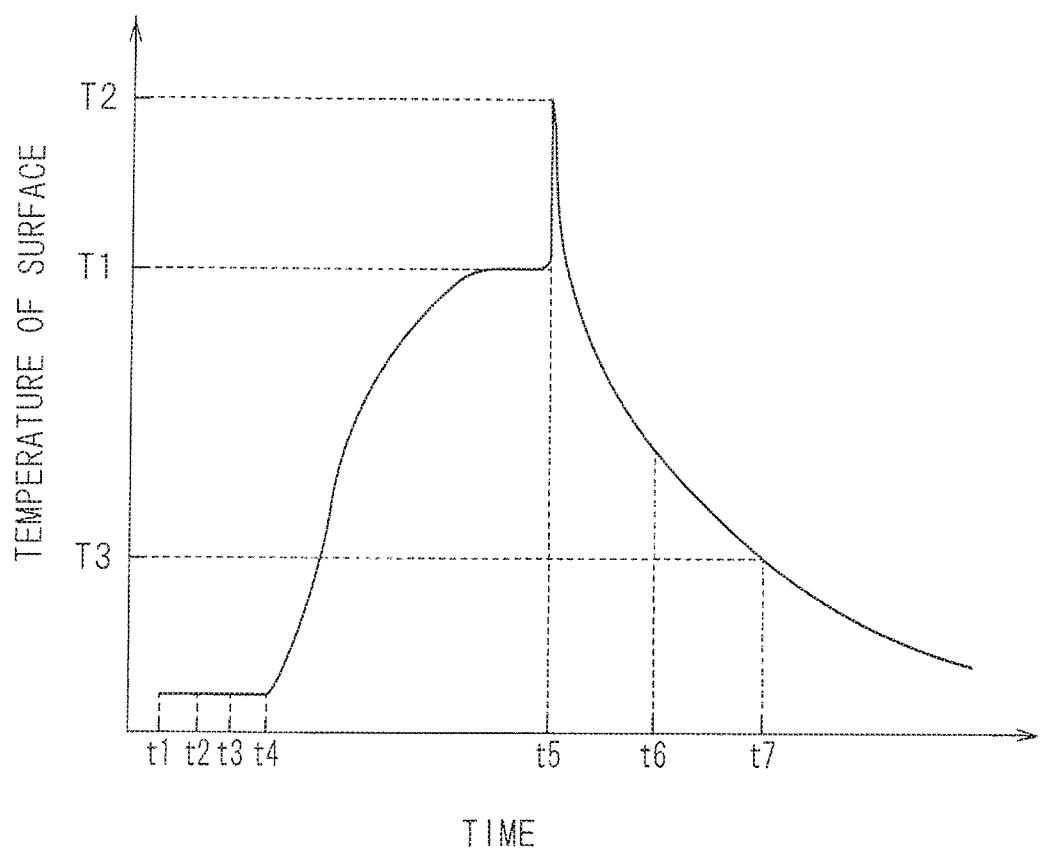
FIG. 10 is a view showing a change in a temperature of a surface of a semiconductor wafer in the heat treatment unit.

The flash heating treatment in the heat treatment unit 160 will continue to be described. FIG. 10 is a view showing a change in a temperature of a surface of a semiconductor wafer in the heat treatment unit 160. After the treatment performed on the preceding semiconductor wafer W is finished and the preceding semiconductor wafer W is transported from the treatment chamber 6, the gate valve 185 remains open, and the transport opening 66 is opened. Then, the transport robot 150 transports the semiconductor wafer W to be treated through the transport opening 66 into the heat treatment space 65 in the treatment chamber 6 at a time t1.

The transport robot 150 causes the transport hand 151a (or the transport hand 151b) that holds the semiconductor wafer W to be treated to move forward to a position immediately over the holder 7 and stop. Then, the pair of transfer arms 11 of the transfer mechanism 10 is moved upwardly at the transfer operation position, whereby the lift pins 12 pass through the through holes 79 and protrude from the upper surface of the holding plate 75 of the susceptor 74 to receive the semiconductor wafer W from the transport hand 151a. At this time, the lift pins 12 move upwardly to above the upper ends of the substrate support pins 77.

After the semiconductor wafer W is protruded upward by the lift pins 12 and placed on the lift pins 12, the transport robot 150 moves the transport hand 151a out of the heat treatment space 65. Then, the treatment performed on the semiconductor wafer W in the heat treatment unit 160 starts at a time t2. Specifically, the valve 84 is opened for supply of gas, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65. The gas within the treatment chamber 6 is exhausted also through the transport opening 66 by opening the valve 192.

After the treatment performed on the semiconductor wafer W starts, the gate valve 185 closes and the transport opening 66 is closed at a time t3. In other words, the semiconductor wafer W is transported into the treatment chamber 6, and the gate valve 185 is closed while nitrogen gas is supplied into the treatment chamber 6. The gate valve 185 is closed and the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that a front surface thereof patterned and implanted with impurities is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is horizontally moved to open, and moved back to the retracted position, i.e. to the inside of the recessed portion 62, by the horizontal movement mechanism 13.

After the semiconductor wafer W is held in a horizontal attitude from below by the susceptor 74 of the holder 7, the 40 halogen lamps HL turn on simultaneously to start preheating (or assist-heating) at a time t4. Halogen light emitted from the halogen lamps HL is transmitted through the lower chamber window 64 and the susceptor 74 both made of quartz, and impinges from the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 shall be on the order of 600° C. to 800° C. (in the present preferred embodiment, 700° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

At a time t5 when a predetermined time period has elapsed since the temperature of the semiconductor wafer W reaches the preheating temperature T1, the flash lamps FL irradiate the upper surface of the semiconductor wafer W with a flash of light. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W on which the flash heating is performed by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Since the flash heating is capable of increasing and decreasing the temperature of the front surface of the semiconductor wafer W in an extremely short time, it is possible to activate the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After the completion of the flash heating treatment, the halogen lamps HL also turn off. Both the flash lamps FL and the halogen lamps HL turn off, thereby rapidly decreasing the temperature of the semiconductor wafer W. The radiation thermometer 20 measures the temperature of the semiconductor wafer W which is on the decrease. The result of measurement is transmitted to the controller 3. The semiconductor wafer W has considerably a high temperature immediately after the completion of the flash heating treatment. If the semiconductor wafer W having such a high temperature is transported from the treatment chamber 6 immediately, the semiconductor wafer W may be oxidized or a thermal damage may be applied to the transport robot 150. Thus, after the completion of the flash heating treatment, the semiconductor wafer W remains in the treatment chamber 6 until the temperature of the semiconductor wafer W decreases to a transportable temperature T3 or less, and then transported from the treatment chamber 6 into the transport chamber 170. The transportable temperature T3 is a temperature which does not cause a damage such as an oxidization even if the semiconductor wafer W on which the heat treatment has been performed is transported from the treatment chamber 6 into the transport chamber 170, that is to say, a temperature at which semiconductor wafer W can be transported from the treatment chamber 6. The transportable temperature T3 is 350° C., for example.

After the flash lamps FL and the halogen lamps HL turn off, the temperature of the semiconductor wafer W decreases to the transportable temperature T3 at a time t7 in the treatment chamber 6. Started in the present preferred embodiment is a transportation preparation operation for transporting the semiconductor wafer W from the treatment chamber 6 at a time t6 prior to the time t7 at which the temperature of the semiconductor wafer W decreases to the transportable temperature T3. Specifically, the pair of transfer arms 11 of the transfer mechanism 10 are horizontally moved from the retracted position to the transfer operation position at the time t6. Then, the pair of transfer arms 11 which have been moved to the transfer operation position is moved upwardly, and the lift pins 12 pass through the through holes 79 and protrude from the upper surface of the holding plate 75 of the susceptor 74. Thus, the semiconductor wafer W held by the susceptor 74 is protruded upward by the lift pins 12 and is received.

At the time t6, the transfer arms 11 receive the semiconductor wafer W, and the gate valve 185 opens and the transport opening 66 is opened. If the transport opening 66 is opened, the atmosphere in the transport chamber 170 may be mixed into the inner side of the treatment chamber 6, however, nitrogen gas continues to be supplied to the treatment chamber 6, such an atmosphere mix can be suppressed. Even if the atmosphere in the transport chamber 170 is slightly mixed into the inner side of the treatment chamber 6, the transport chamber 170 is also filled with the clean nitrogen atmosphere, thus an increase in the oxygen concentration in the treatment chamber 6 can be minimized and the oxidation of the semiconductor wafer W can be prevented. If the transport opening 66 is opened when the temperature of the semiconductor wafer W is high immediate after the flash heating treatment, there is a concern that the semiconductor wafer W may be oxidized due to the slight increase in the oxygen concentration in the treatment chamber 6, thus the time t6 at which the gate valve 185 is opened is preferably set to a point of time when the temperature of the semiconductor wafer W decreases to an opening openable temperature (for example, 500° C.) or less that there is no concern on the oxidization of the semiconductor wafer W due to the atmosphere mixed into the inner side of the treatment chamber 6.

The transport robot 150 causes the empty transport hand 151b (or the transport hand 151a) to enter from the transport opening 66 at the time t7 at which the temperature of the semiconductor wafer W supported by the lift pins 12 decreases to the transportable temperature T3 in the chamber 6, move forward to a position immediately below the semiconductor wafer W supported by the lift pins 12, and stop. Then, when the pair of transfer arms 11 move downwardly, the semiconductor wafer W on which the heat treatment has been performed is transferred from the lift pins 12 to the transport hand 151b and placed. Subsequently, the transport robot 150 moves the transport hand 151b out of the treatment chamber 6 to transport the semiconductor wafer W which has been processed out of the treatment chamber 6.

In the meanwhile, the pair of transfer arms 11 which move downwardly and from which the lift pins 12 are taken out of the through holes 79 do not return to the retracted position from the transfer operation position but stops in the transfer operation position. That is to say, even after the semiconductor wafer W which has been processed is transported from the treatment chamber 6, the pair of transfer arms 11 do not return to the retracted position but remain in the transfer operation position.

The wafer sensor 155 determines whether or not the transport hand 151b holds the semiconductor wafer W after the transport hand 151b, which has received the semiconductor wafer W which had been processed, moves out of the transport opening 66 until the transport hand 151b returns to a home position in the transport chamber 170 and stops. That is to say, the wafer sensor 155 confirms whether or not the transport hand 151b holds the semiconductor wafer W during a period of travel time from when the transport hand 151b receives the semiconductor wafer W and moves out of the transport opening 66 until when the transport hand 151b returns to the home position and stops.

Subsequently, in the heat treatment unit 160, the procedure similar to that in the above description is repeated. That is to say, the transport robot 150 causes the transport hand 151a that holds the semiconductor wafer W to be newly treated to enter the treatment chamber 6 from the transport opening 66, and the pair of transfer arms 11 which do not return to the retracted position but remain in the transfer operation position is moved upwardly to receive the semiconductor wafer W. Then, after the transport robot 150 moves the transport hand 151a out of the treatment chamber 6, the heat treatment unit 160 starts the treatment on the new semiconductor wafer W.

Figure 11:
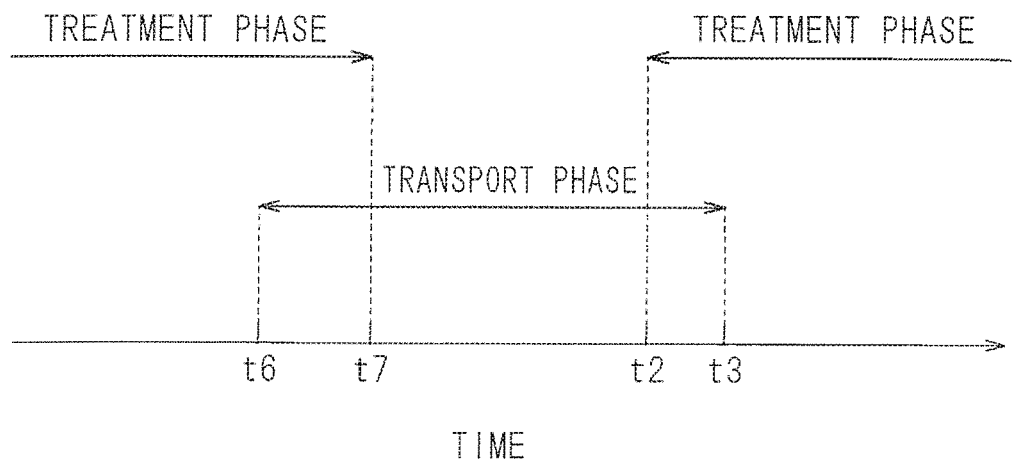
FIG. 11 is a timing chart conceptually showing a transport operation of the semiconductor wafer in the heat treatment unit.

FIG. 11 is a timing chart conceptually showing a transport operation of the semiconductor wafer W in the heat treatment unit 160. The times shown in FIG. 11 are associated with those in FIG. 10. In the present preferred embodiment, the treatment on one semiconductor wafer W is started at the time t2 and completed at the time t7 in FIG. 10. Thus, the period of time from the time t2 to the time t7 is a treatment phase of the semiconductor wafer W. FIG. 11 shows a treatment phase of a preceding semiconductor wafer W and a treatment phase of a subsequent semiconductor wafer W.

An operation of transporting the semiconductor wafer W, which has been processed, outside the heat treatment unit 160 is started at the time t6 and an operation of transporting the new semiconductor wafer W inside the heat treatment unit 160 is completed at the time t3 in FIG. 10. Thus, the period of time from the time t6 to the time t3 is a transport phase of the semiconductor wafer W. In the present preferred embodiment, the transport phase is started before the treatment phase is completed as shown in FIG. 11. Specifically, the transportation preparation operation for transporting the semiconductor wafer W from the treatment chamber 6 is started at the time t6 prior to the time t7 at which the temperature of the semiconductor wafer W decreases to the transportable temperature T3. The transportation preparation operation includes the opening of the gate valve 185 and the driving of the transfer arms 11. Conventionally, the transportation preparation operation is performed after the temperature of the semiconductor wafer W decreases to the transportable temperature T3, however, in the present invention, the transportation preparation operation is started before the temperature of the semiconductor wafer W decreases to the transportable temperature T3, thus the time required for transporting the semiconductor wafer W from the treatment chamber 6 can be reduced.

As shown in FIG. 11, the transport phase is finished after the treatment phase is started. Specifically, the operation of closing the gate valve 185 and transporting the semiconductor wafer W into the treatment chamber 6 is completed at the time t3 subsequent to the time t2 at which the treatment on the semiconductor wafer W is started. Conventionally, the treatment on the semiconductor wafer W is started after the operation of transporting the semiconductor wafer W into the treatment chamber 6 is completed, however, in the present invention, the treatment on the semiconductor wafer W is started before the operation of transporting the semiconductor wafer W into the treatment chamber 6 is completed, thus the time required for transporting the semiconductor wafer W into the treatment chamber 6 can be reduced.

In short, the treatment phase and the transport phase of the semiconductor wafer W are overlapped with each other, thus the time required for transporting the semiconductor wafer W into and out of the treatment chamber 6 can be reduced. As a result, a throughput in the heat treatment apparatus 100 can be increased.

In the present preferred embodiment, even after the semiconductor wafer W which has been processed is transported from the treatment chamber 6, the pair of transfer arms 11 do not return to the retracted position but remain in the transfer operation position. Unnecessary accordingly are the time required for the transfer arms 11 to return from the transfer operation position to the retracted position after transporting the semiconductor wafer W which has been processed from the treatment chamber 6 and the time required for the transfer arms 11 to move from the retracted position to the transfer operation position at the time of transporting the new semiconductor wafer W into the treatment chamber 6. As a result, the time required for transporting the semiconductor wafer W into and out of the treatment chamber 6 can be reduced.

Furthermore, in the present preferred embodiment, it is determined whether or not the transport hand 151b holds the semiconductor wafer W during a period of travel time from when the transport hand 151b of the transport robot 150 receives the semiconductor wafer W and moves out of the transport opening 66 until when the transport hand 151b stops. Conventionally, the presence or absence of the semiconductor wafer W is confirmed after the transport hand 151b returns to the home position and stops, however, the presence or absence of the semiconductor wafer W is determined in the period of travel time before the transport hand 151b stops as is the case for the present preferred embodiment, thus the time required for determining the presence or absence of the semiconductor wafer W can be reduced.

While the preferred embodiments according to the present invention have been described hereinabove, various modifications of the present invention are possible in addition to those described above without departing from the scope and spirit of the present invention. For example, the presence or absence of the semiconductor wafer W is determined in the period of time of moving the transport hand 151b in the preferred embodiment described above, however, the presence or absence of the semiconductor wafer W may also be confirmed when the transport hand 151b returns to the home position and stops. An amount of misregistration of the semiconductor wafer W in the transport hand 151b may be detected in addition to the determination of the presence or absence of the semiconductor wafer W.

Although the 30 flash lamps FL are provided in the flash lamp house 5 in each of the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen lamp house 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as continuous lighting lamps to preheat the semiconductor wafer W.

Moreover, a substrate to be treated by the heat treatment apparatus 100 is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of heating a substrate by irradiating said substrate with light, the heat treatment method comprising:
   (a) heating a first substrate being held by a susceptor in a chamber by irradiating said first substrate with light from lamps; and
   (b) turning off said lamps to cool said first substrate to a transportable temperature at which said first substrate can be transported from said chamber,
   wherein a transportation preparation operation for transporting said first substrate from said chamber is started after a temperature of said first substrate decreases to a temperature at which said first substrate is not oxidized or less and before said temperature of said first substrate decreases to said transportable temperature,
   wherein the transportation preparation operation includes:
   (c-1) opening a gate valve being provided in a transport opening being formed for transporting a substrate into and out of said chamber; and
   (c-2) moving transfer arms for transferring a substrate with respect to the susceptor from a retracted position being located outside said susceptor to a transfer operation position being located below said susceptor, and moving up said transfer arms and causing lift pins being provided upright on said transfer arms to protrude from an upper side of said susceptor, thereby receiving said first substrate,
   wherein the heat treatment method further comprises (d) causing a transport hand of a transport robot being provided outside said chamber to receive said first substrate whose temperature is decreased to said transportable temperature from said lift pins and transport said first substrate from said chamber,
   wherein even after said first substrate is transported from said chamber, said transfer arms do not return to said retracted position but remain in said transfer operation position, and
   wherein it is determined whether or not said transport hand holds said first substrate in a period of time from when said transport hand receives said first substrate and moves out of said transport opening until when said transport hand stops.

2. The heat treatment method according to claim 1, further comprising
   (e) causing said transport hand of said transport robot to transport a second substrate from said transport opening into said chamber after said first substrate is transported from said chamber, wherein
   said gate valve is closed after said second substrate is transported into said chamber and a treatment on said second substrate is started.

3. The heat treatment method according to claim 2, wherein
   said gate valve is closed while said second substrate is transported into said chamber and a treatment gas is supplied to said chamber.

4. A heat treatment method of heating a substrate by irradiating said substrate with light, the heat treatment method comprising:
   (a) heating a first substrate being held by a susceptor in a chamber by irradiating said first substrate with light from lamps; and
   (b) turning off said lamps to cool said first substrate to a transportable temperature at which said first substrate can be transported from said chamber,
   wherein a transportation preparation operation for transporting said first substrate from said chamber is started after a temperature of said first substrate decreases to a temperature at which said first substrate is not oxidized or less and before said temperature of said first substrate decreases to said transportable temperature,
   wherein the transportation preparation operation includes:
   (c-1) opening a gate valve being provided in a transport opening being formed for transporting a substrate into and out of said chamber; and
   (c-2) moving transfer arms for transferring a substrate with respect to the susceptor from a retracted position being located outside said susceptor to a transfer operation position being located below said susceptor, and moving up said transfer arms and causing lift pins being provided upright on said transfer arms to protrude from an upper side of said susceptor, thereby receiving said first substrate,
   wherein the heat treatment method, further comprises (d) causing a transport hand of a transport robot being provided outside said chamber to receive said first substrate whose temperature is decreased to said transportable temperature from said lift pins and transport said first substrate from said chamber, and
   wherein after said first substrate is transported from said chamber, said transfer arms do not return to said retracted position but remain in said transfer operation position until said transfer arms receive a second substrate to be newly processed.

* * * * *